United States Patent [19]

Olsson

[11] 4,206,964

[45] Jun. 10, 1980

[54] TERMINAL DEVICE HAVING IMPROVED RETENTION MEANS

[75] Inventor: Billy E. Olsson, New Cumberland, Pa.

[73] Assignee: AMP Incorporated, Harrisburg, Pa.

[21] Appl. No.: 691,167

[22] Filed: May 28, 1976

[51] Int. Cl.$^2$ .......................... H01R 9/16; H05K 1/18; B21D 53/00

[52] U.S. Cl. .................................. 339/221 M; 29/874; 113/119

[58] Field of Search ...................... 339/17 C, 220, 221, 339/252 P; 29/630 R, 630 D; 113/119; 72/326, 332

[56] References Cited

U.S. PATENT DOCUMENTS 3,696,323 10/1972 Kinkaid .............................. 339/17 C

FOREIGN PATENT DOCUMENTS 952792 8/1974 Canada ...................................... 72/326

2435461 2/1975 Fed. Rep. of Germany ...... 339/221 R

*Primary Examiner*—Neil Abrams

*Attorney, Agent, or Firm*—Frederick W. Raring

[57] ABSTRACT

A terminal device such as a terminal post has a retaining portion comprising opposed outwardly formed spring members which are flexible toward each other upon movement of the retaining portion into a hole having a diameter which is less than the maximum transverse dimension of the retention portion so that the terminal device is held in the hole. The retention portion is formed by shearing a blank and displacing material on opposing sides of the shear line in opposite directions parallel to the plane of shearing. Thereafter, the displaced portions are further displaced laterally away from each other and normally of the plane of shearing so that they are separated. Finally, the two displaced portions are formed parallel to the plane of shearing in opposite directions towards each other until they are substantially co-planar.

9 Claims, 15 Drawing Figures

FIG. 11
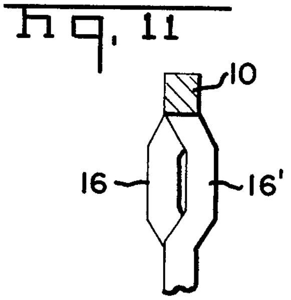
FIG. 12
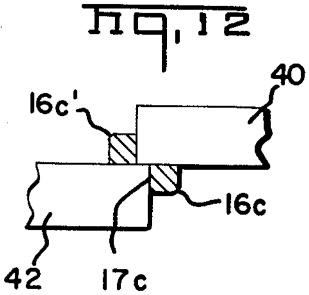
FIG. 13
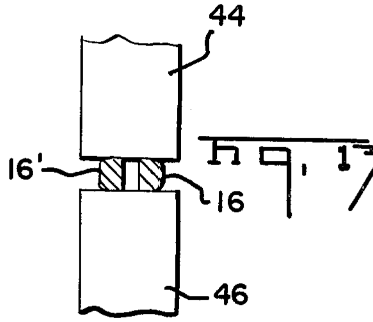
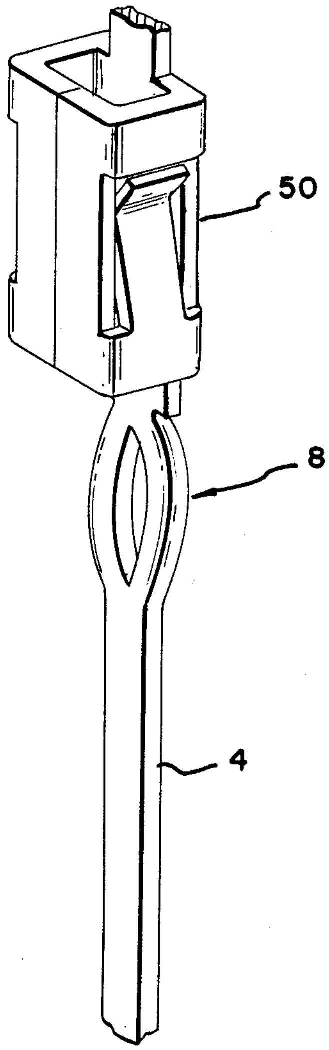
FIG. 14

TERMINAL DEVICE HAVING IMPROVED RETENTION MEANS

BACKGROUND OF THE INVENTION

This invention is directed to the achievement of a terminal device having an improved retention portion for retaining the device in a hole in a panel-like member such as a printed circuit board. The herein disclosed embodiment of the invention comprises a terminal post however, the principles of the invention can be used with other terminal devices.

Terminal posts having rectangular cross-sections are widely used in the electrical industry in conjunction with printed circuit boards and panel boards for making electrical connections between, and among, electrical circuits. For example terminal posts on a panel board are frequently used for point to point wiring requirements by connecting predetermined posts to each other with wires which are connected to the individual posts by wrap-type or clip-type terminations. It is also common practice to use multi-contact electrical connectors with terminal posts, the connectors having socket-type contact terminals therein which are mated with the posts on the panel or printed circuit board.

One method of mounting the terminal posts on the board is to provide the posts with an enlarged portion which is dimensioned to have a force fit in the hole of a printed circuit board or panel. The post is simply driven into the board or staked to the board and the resulting interference fit is relied upon to hold the post on the board. The staking method gives rise to several troublesome problems and its shortcomings have long been recognized. For example, the panel or PC board may be severely damaged as a result of driving the oversized portion of the post into the hole. The board may be chipped and, if the hole is plated with conducting material, the plating may be badly scored or even broached from the hole. If the staking method is used on printed circuit boards, the portion of the printed circuitry on a surface of the board may be lifted therefrom while the staking operation is being carried out and the damage thus caused may render the board completely useless. Even if there is no significant damage to the panel or board, the effect of staking a large number of terminal posts may give rise to internal stresses in the board which in turn, cause it to assume a curved or arcuate shape rather than a flat plane. Finally, the force required to drive a post into an undersized hole is quite high and the insertion machinery must be undesirably robust to carry out the operation.

The problems encountered with the staking process described above have inspired the proposal of alternative methods of mounting terminal posts or other terminal devices in circular holes. For example, it has been proposed that a portion of the terminal post be formed as a spring member capable of deflecting during insertion and exerting a frictional force against the walls of the hole after insertion.

The instant invention is specifically directed to the achievement of an improved retention means which can be imparted to terminal posts during manufacture thereof by a few relatively simple stamping and forming methods.

It is among the objectives of the invention to provide a retaining means on a terminal device such as a terminal post or the like having characteristics which permit the terminal device to be inserted into a hole without unduly high insertion forces being required. A further object is to provide a spring-type retaining means on a terminal device which can be used in post-receiving holes which may vary between relatively wide limits as regards hole diameter. A further object of the invention is to provide a retaining means on a terminal post or the like which will not cause damage to the panel or printed circuit board into which it is inserted or to the circuitry thereon and will not give life to distortion in the panel or printed circuit board which might arise from unduly high internal stresses.

These and other objects of the invention are achieved in preferred embodiments of the invention, which are briefly described in the foregoing abstract, which are described in the detail below and which are shown in the accompanying drawing in which.

Figure 3:
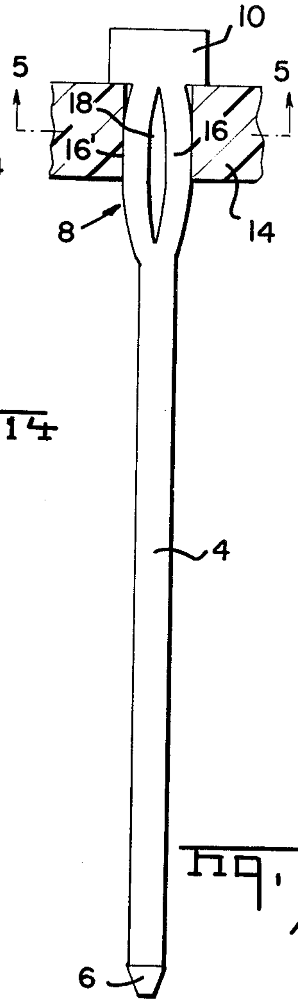
FIG. 3 is a cross-sectional view showing a portion of a panel-like member having a terminal post mounted therein, this view illustrating the condition which exists when the hole in the panel-like member has a relatively large diameter, that is, the diameter is at the outer limit of the tolerance range for the hole.
Figure 4:
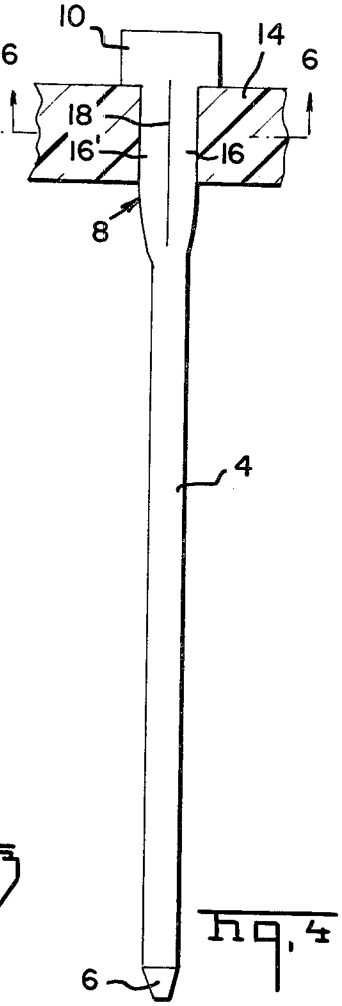
FIG. 4 is a view similar to FIG. 3 but showing the condition which exists when the hole in the panel-like member has a diameter which is at the lower limit of the tolerance range.
Figure 5:
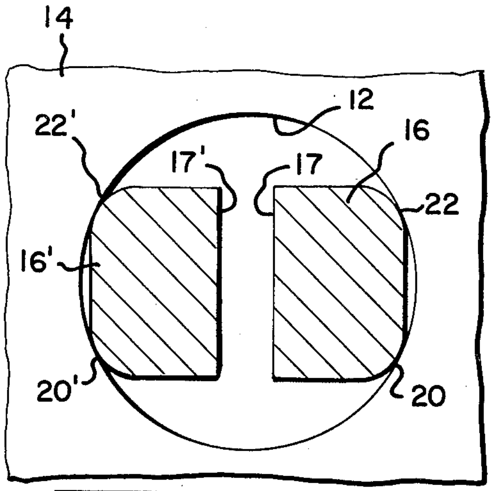
Figure 6:
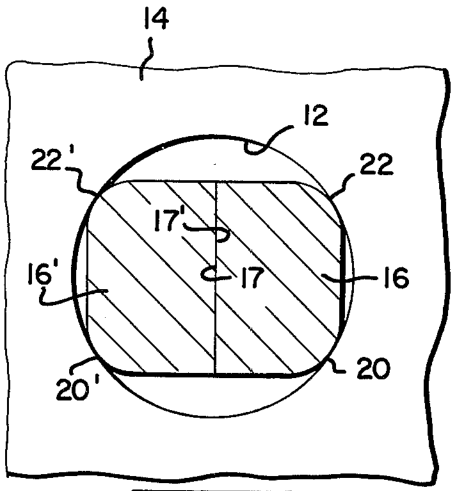

FIGS. 5 and 6 are views taken along the lines 5—5 and 6—6 of FIGS. 3 and 4 respectively.

Figure 1:
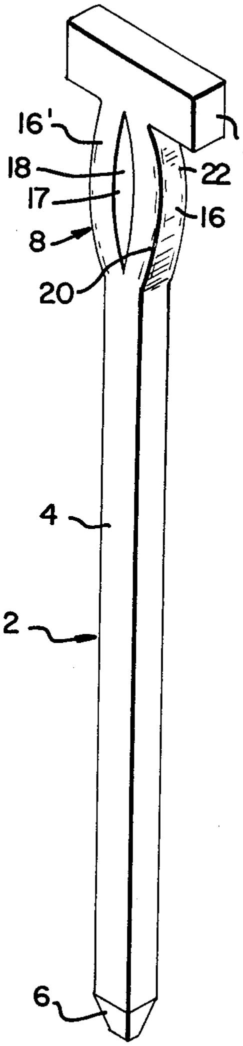
FIG. 1 is a perspective view of a preferred form of terminal post in accordance with the invention.
Figure 7:
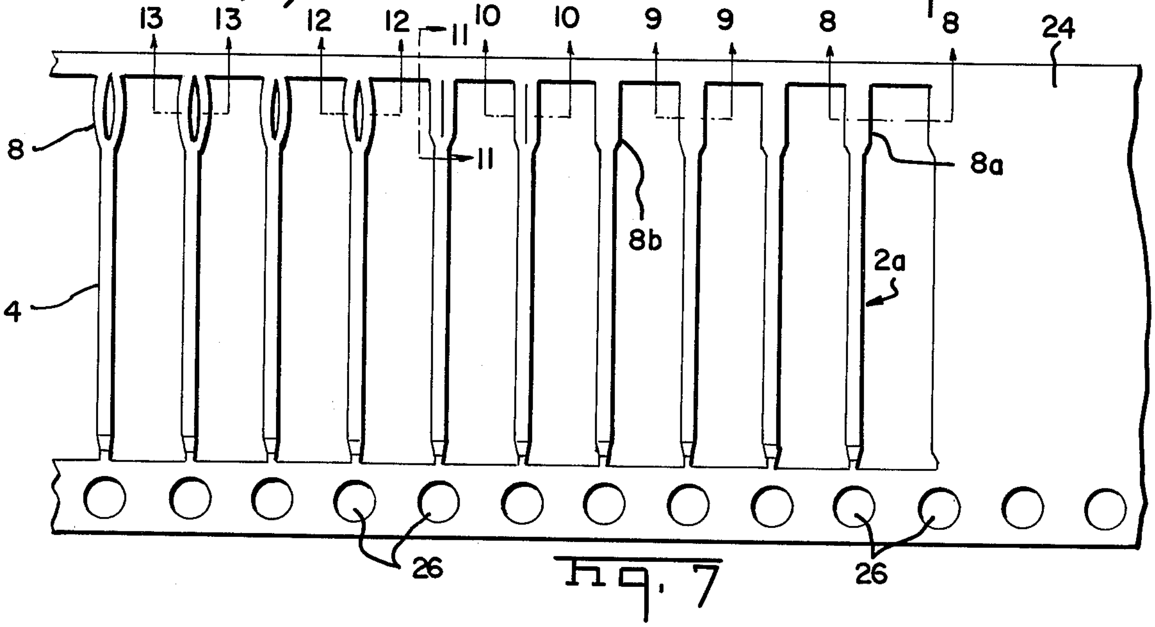
Figure 8:
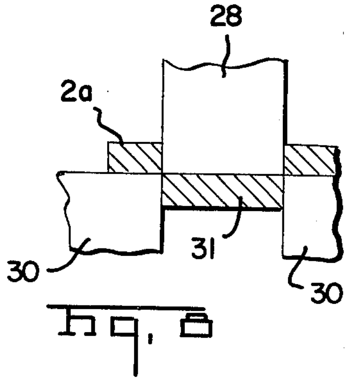
Figure 9:
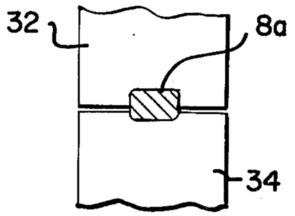

FIG. 7 is a plan view of a portion of a progressive stamping die illustrating the stamping and forming steps which are carried out to produce the terminal post in FIG. 1.

FIGS. 8, 9, 10, 11, 12 and 13 are all views taken along the corresponding section lines 8—8 et. seq. of FIG. 7.

Figure 14:
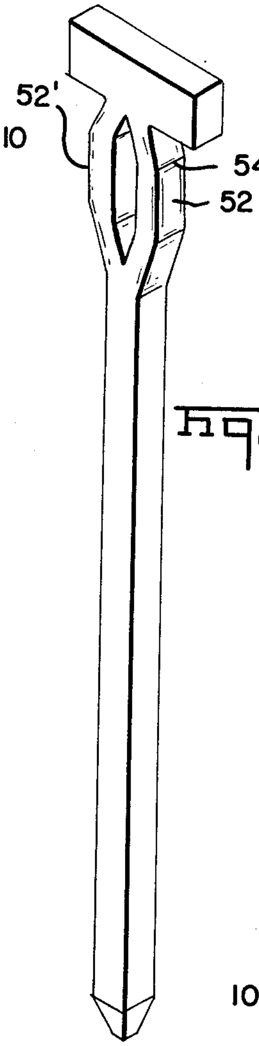

FIG. 14 is a perspective view of an post having an alternative form of retaining means in accordance with the invention.

FIG. 15 is a perspective view of a terminal device having a socket portion, a post portion and an intermediate retaining portion in accordance with the invention.

Figure 2:
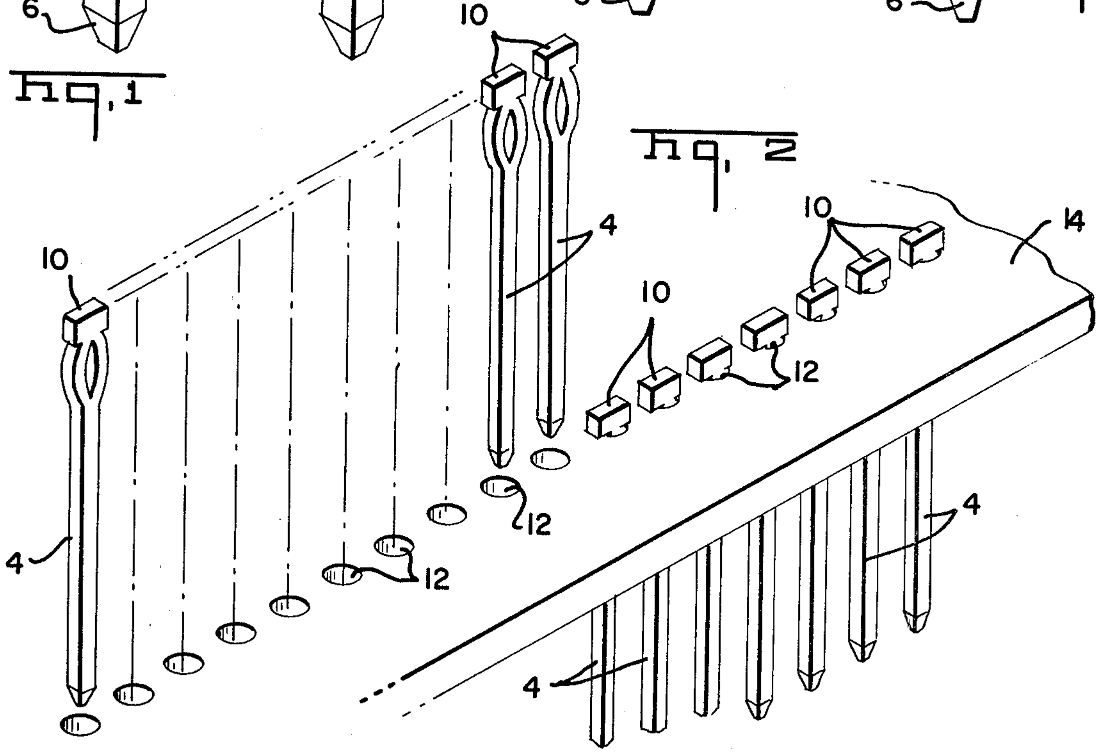
FIG. 2 is a fragmentary perspective view of a portion of a panel-like member having terminal posts in accordance with the invention mounted therein.

Referring first to FIG. 1, a terminal device 2 in accordance with the invention comprises a post portion 4 having a rectangular cross-section, a lower end 6 which may be tapered as shown, a head portion 10 at its upper end and a spring retaining portion 8 which is immediately below the head 10. Posts of this type are ordinarily driven into holes 12 in a panel-like member 14 as shown in FIG. 2. The holes 12 have a nominal diameter that is less than the maximum transverse dimension of the retaining portion 8. As will be explained below, the retaining portion comprises a spring-system which, upon insertion into the hole, produces retaining forces which act between the walls of the hole and the terminal device.

The retaining portion 8 comprises two generally arcuate spring members 16—16′ which have opposed concave surfaces 17 separated by an opening 18. The oppositely directed external surfaces of the spring members 16, 16′ are generally convex. This opening has the shape of a double segment, that is two segments having a common chord. The chord in the embodiment shown extends along the vertical axis of the post 4 and the retaining portion is symmetrical with reference to this vertical axis. The two spring members 16, 16′ have rounded or radiused corners 20, 22, 20′, 22′, and the maximum transverse dimension of the retaining portion is midway between the upper and lower ends of the opening 18 and between diametrically opposite corners see FIG. 5. When the terminal post 2 is inserted into an opening 12 in a printed circuit board, the rounded corners 20, 22, 20′, 22′ come into engagement with the wall portions of the hole 12. Since the maximum transverse dimensions are between opposed corners 20, 22′ and 20′, 22 as shown in FIG. 5, the spring members 16, 16′ will be flexed towards each other to varying degrees depending upon the actual diameter of the hole 12 and by virtue of the resilient flexure imparted to the spring members, they will exert a force against the wall of the hole 12 at the four corners. The rounded corners facilitate movement of the retaining portion 8 into the hole 12 and by virtue of the fact that these corners are rounded, severe scoring or broaching effects are avoided. The avoidance of such scoring effects is particularly desirable where the wall portions of the hole are plated with conductive metal.

A terminal device in accordance with the invention can be used in holes 12 having diameters which vary within relatively wide dimensional ranges for the reason that the spring members 16, 16′ will simply be flexed to an increasing extent as the hole diameter is reduced. In fact, the diameter of the hole 12 may be such that the opposed surfaces 17, 17′ move against each other as shown in FIG. 6 and if the hole has a diameter which is somewhat smaller than the diameter shown in FIG. 6, the terminal post can be inserted with accompanying staking as explained above, however, it is desirable to avoid staking if possible.

As mentioned previously, terminal devices in accordance with the invention can be driven into holes with relatively low insertion forces as compared with terminals having previously known types of spring retention systems and as compared with the insertion forces required for staking operations. A feature of the invention which contributes materially to the achievement of these low insertion forces is the fact that the spring members 16, 16′ are separated by the opening 18 and their opposed surfaces 17, 17′ are not against each other. Thus, when a post terminal 2 is driven into a hole 12, the spring members are flexed and are partially straightened. But, since the surfaces 17, 17′ are not against each other, they do not slide over each other during insertion and the high sliding fricton forces which would result from such sliding motion are avoided. Such high friction forces would, of course, materially increase the insertion force required.

Terminal posts in accordance with the invention can advantageously be manufactured by stamping and forming methods as illustrated in FIGS. 7–13. The material of the strip metal 24 may be any suitable metal used for electrical terminals such as a Cu, Sn, Ni alloy, phosphor bronze, or brass, in a relatively hard condition, for example, number 4 hard to number 6 hard. FIG. 7 illustrates the stamping and forming operations carried out in the progressive die to produce the terminal device shown in FIG. 1.

Figure 10:
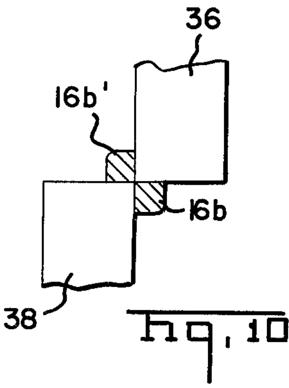

The metal strip 24 is ordinarily provided with pilot holes 26 by means of which it is fed through the die. At the first station, FIG. 8, the stock metal is blanked by a blanking punch 28 and die 30 which punch out the scrap 31 to form the spaced apart blanks 2*a*. Thereafter, the blank is subjected to a swaging operation (FIG. 9) in which the four corners are rounded or radiused by upper and lower swaging tools 32, 34. In the next station, FIG. 10, the enlarged portion 8*a* of the blank 2*a* is sheared by upper and lower shearing tooling 36, 38 and the two spring members 16*b*, 16*b*′ are produced. As illustrated in FIG. 10, the member 16*b* is displaced downwardly relatively to the plane of the strip 24 and the member 16*b*′ is displaced upwardly, these motions or movements being parallel to the plane of shearing as will be apparent from FIG. 10. In the next station in the die, FIG. 12, displacing tools 40, 42 move against the surfaces 17*c*, 17*c*′ to move the portion 16*c*′ leftwardly and the portion 16*c* rightwardly as viewed in FIG. 12. It is this operation which produces the opening 18 in the partially formed terminal post and the faces of the forming tools 40, 42 are contoured to produce the arcuate surfaces 17, 17′. Finally, as shown in FIG. 13, the strip is passed between flattening tooling 44, 46 which displaces the two spring sections towards each other and parallel to the plane of shearing so that after leaving this station, the upper and lower surfaces of the spring members 16, 16′ are substantially co-planar as shown in FIG. 13. It will be realized that in actual practice, the finished product will have some tooling marks on its surfaces but the cross-section will be substantially as shown in FIG. 13.

It should be mentioned that the forming operations carried out and illustrated in FIGS. 9–13 can also be carried out on metal stock material which initially has a rectangular cross-section; that is, upon wire having a rectangular cross-section of the type commonly used in the manufacture of terminal posts. In accordance with this embodiment, the wire is fed axially through a forming machine and the tooling for carrying out the operations of FIGS. 9–13 is provided on opposite sides of the feed path.

FIG. 14 shows another form of terminal post in accordance with the invention in which the retaining portion has parallel outwardly facing surfaces as shown at 52, 52′. The spring members in this embodiment are not precisely arcuate but have fairly distinct angular discontinuities as shown at 54. This form of the invention can be produced by providing forming surfaces on the ends of the displacing tools 40, 42 which complement the shapes shown in FIG. 14. The embodiment of FIG. 14 provides the relatively flat surfaces 52, 52′ and for this reason, it may be found to be desirable where the posts are to be inserted into relatively thin panel-like members.

Terminal devices in accordance with the invention can be made in many different sizes for different size printed circuit board holes. The specific nominal dimensions set forth below of a typical terminal post will serve as a guide, for example, to those wishing to design terminal devices in accordance with the principles of the invention. The dimensions presented below are nominal dimensions and are defined in terms of the reference numerals in the accompanying drawing.

A terminal post in accordance with the invention was manufactured from a 9% Ni, 2.2% Sn, bal. Cu alloy strip in a temper 6 hardness having a thickness of 0.025″. The terminal post portions 4 were therefore, of square cross-section having a width of 0.025″ on each side. The width of the portion 8*b* (FIG. 7) of the blank was 0.034″ and the length of this section of the blank was about 0.100. After shearing and forming as shown in FIGS.

10–13, the retaining portion of the finished terminal had a width between its outwardly facing sides of 0.045" and the diagonal dimension between the corners 20, 22' (FIG. 5) was about 0.050". The length of the opening 18 as measured along the axis of the post 4 was about 0.10" and the maximum width of this opening was 0.011". The ends of the opening were sharpley pointed as shown. The retaining portion could thus be compressed as shown in FIG. 6 to substantially its original width of 0.034" and its original diagonal dimension of 0.042".

It will readily be apparent to those skilled in the stamping and forming art that a terminal device as described above and as shown in the drawing could not be produced by conventional stamping operations, that is by simply punching a flat blank and punching the opening 18 in the blank by a conventional punch and die. There is a lower limit to the size of opening which can be punched in metal stock and it is a rule of thumb that the smallest circular hole which can be punched in a given type of metal stock has a diameter equal to the thickness of the stock. It would thus be impractical if not totally impossible to punch a hole having sharply pointed ends as shown. The tooling would be expensive to manufacture and would be short lived. Furthermore, it would be difficult to strip the punched stock from the tooling; that is, even if the opening could be punched by a punch and die, it would be difficlt to withdraw the punch from the stock during the upward stock of the die shoe.

The stamping and forming operations described above have been carried out at extremely high speeds to produce the embodiment of the invention shown. In fact, speeds in the range of 500–700 strokes per minute were achieved and the process described above, therefore, it is capable of producing terminal devices at an extremely low cost.

Terminal devices having the dimensions set forth can be used in printed circuit board holes having a nominal diameter of about 0.042" with a tolerance range in the hole of ±0.005". In fact, in one specific test conducted with terminal posts having the dimensions presented above, posts were inserted into printed circuit board holes having a diameter of 0.036" and the insertion force required varied between 25 lbs. and about 32 lbs. The push out force required to remove the force from the board was in the range of 15 to 21 lbs. Thus the insertion force required even for these undersized holes was not excessive.

In other tests, terminal posts having the dimensions presented above were inserted into printed circuit board holes having a diameter of 0.045" and the inserting force varied from 11 lbs. to about 20 lbs. The push out force was observed to lie within a relatively narrow range about 9.6 to 11 lbs.

The retaining portion 8 described above can be provided on terminal devices of many different types in addition to the simple terminal posts described above. For example, FIG. 15 shows a terminal device having a socket portion 50 and having a post extending from the lower end of the socket portion. This post has a retaining means 8 integral therewith adjacent to the socket portion so that terminals of the type shown in FIG. 15 can be inserted into a printed circuit board.

In the foregoing description, frequent reference has been made to the use of terminal devices in accordance with the invention in printed circuit boards having plated through holes, a distinct advantage of the invention being that scoring or broaching effects and damage to the plating is avoided by the practice of the invention.

It is, of course, conventional practice to solder terminal devices to printed circuit boards having plated through holes and the shape of the retaining portion 8 of the terminal posts 2 is advantageous in that solder will wick into the hole readily and wet both the terminal and the sidewalls of the holes. Soldering can also be carried out in many circumstances where the holes are not plated and a bond or electrical joint will be obtained between the terminal 2 and the conductor on the surface of the printed circuit board.

The invention is also advantageous when it is desired to simply insert terminal posts or other terminal devices into a panel having unplated holes on closely spaced centers and no soldering is carried out. Simple panel members having a multiplicity of terminal posts mounted therein in accordance with a coordinate grid system are widely used for point-to-point wiring applications. As mentioned previously, it is common practice to stake the terminal posts to the board, that is, to provide an interference fit between the terminal posts and the holes in the panel. When this staking method of mounting posts in panel boards is used, high insertion forces are required and severe stresses are developed in the board because of the interference fit of each of the numerous terminals and the hole in which it is staked. These stresses in turn often lead to warpage of the panel which diminishes its usefullness or may even render it useless for its intended purpose. Problems of this type can be avoided by using a retaining system in accordance with the instant invention in that the precise dimensions in the retaining portion 8 of each terminal post can be varied very slightly by very minor changes in the stamping and forming die so as to achieve optimum conditions as regards the insertion forces required and stresses established in the panel board. In other words, a retaining means 8 in accordance with the invention is under the control of the designer of the panel board and he can avoid undesirably high insertion forces and/or board warpage by judicious selection of the dimensions of his parts (the dimensions of the retaining portion 8 of the terminal in the diameter of the hole in the panel board).

It should be mentioned that by virtue of the fact that low insertion forces will suffice for terminal devices in accordance with the invention, the insertion of a plurality of terminal devices onto a like plurality of holes in a single insertion stroke becomes entirely practical. Thus the invention makes possible the use of insertion machines having an inserter which inserts a plurality of posts simultaneously so that panel members and printed circuit boards can be manufactured in reduced time and at reduced costs.

It will be noted from FIG. 12 that the maximum diagonal dimension, that is the distance between the corners 20 and 22', is substantially greater than this in dimension after flattening as shown in FIG. 13. Under some circumstances, it may be expedient to eliminate the flattening step of FIG. 13 in order to permit the use of the part in a grossly oversized hole. The flattening step is desirable, however, in that after insertion of the device into a hole, four bearing areas of the retention portion on the walls of the hole are obtained rather than the two bearing points which are obtained if the finished part has the cross-section of FIG. 12, that is if the flattening step is not carried out.

What is claimed is:

1. An electrical terminal device which is intended for use on a panel-like member such as a printed circuit board, said device having a retaining portion which is intended to be received in a hole in said panel-like member to retain said terminal device on said panel-like member:

said retaining portion comprising a pair of opposed substantially co-planar spring members, said spring members being outwardly formed and having generally concave internal sides which oppose, and are in substantial alignment with, each other, said spring members having oppositely directed generally convex external sides, said spring members being integral with each other at their ends, the opening between said spring members being in the form of a double segment, said spring members being flexible towards each other upon movement of said retaining portion into a hole having a diameter which is less than the maximum transverse dimension of said spring members, said retaining portion having been produced by first shearing a blank between the sides thereof without removal of material and displacing portions of material on each side of the shear line in opposite directions parallel to the plane of shearing and away from each other, and then displacing said portions of material in opposite directions normally of the plane of shearing and away from each other, and finally, displacing said portions of material parallel to the plane of shearing and towards each other until said portions of material are substantially within the plane of the original blank whereby, upon insertion of said terminal device into a hole in a panel-like member, said spring members are flexed towards each other and said outwardly facing convex surfaces bear against the wall of said hole and retain said terminal device in said hole.

2. An electrical terminal device as set forth in claim 1, said spring members being arcuate.

3. An electrical terminal device as set forth in claim 1, said terminal device comprising a post portion, said retaining portion being immediately adjacent to, and integral with, said post portion.

4. An electrical terminal device as set forth in claim 1, said device having a contact socket portion integral with said retaining portion.

5. An electrical terminal device having a post portion which is adapted to be inserted through a hole in panel-like member such as a printed circut board, said terminal device having a retention portion for frictionally retaining said post in said panel-like member:

said retention portion being between one end of said device and said post portion, said retaining portion comprising a pair of co-planar opposed and aligned spring members which are separated from each other by an opening which extends axially with respect to said post portion, said opening having opposed outwardly bowed sidewalls which intersect at each end of said opening so that the center line of said opening is parallel to the axis of said post portion, said retention portion having been formed without removal of material by first shearing said device in the zone of said retention portion along a shear line which extends parallel to the axis of said post portion, and displacing material on each side of said shear line in opposite directions and parallel to the plane of shearing to define said spring members, thereafter displacing said spring members in opposite directions away from said plane of shearing, and finally displacing said spring members in opposite directions towards each other and substantially parallel to said plane of shearing until said spring members are in substantially co-planar relationship whereby, upon insertion of said terminal device into a hole which has a diameter which is less than the maximum transverse dimension of said spring members, said spring members are flexed towards each other and the outwardly facing surfaces of said spring members bear against the wall of said hole so that said terminal device is retained in said hole.

6. An electrical terminal device as set forth in claim 5, said device having been manufactured by stamping and forming operations in a progressive die.

7. The method of making an electrical terminal device of the type intended to be inserted into a hole in a printed circuit board said method comprising the steps of shearing a generally rectangular blank along a shear line which extends between two ends of said blank without shearing said blank to said ends and then displacing material on each side of said shear line in opposite directions normally of the plane of said blank thereby to provide two spring members, displacing said spring members in opposite directions parallel to the plane of said blank and normally of the plane of shearing so that said members extend outwardly from the ends of said blank and in opposite directions away from the plane of said blank, displacing said members in opposite direction towards each other and until both of said members are in the plane of said blank thereby to produce a retaining portion comprising oppositely directed spring members which are integral with each other at their ends and which are separated by an opening extending between the ends of said retaining portion.

8. The method set forth in claim 7, said method being carried out in a progressive stamping die.

9. The method set forth in claim 8, said terminal device comprising the terminal post, said retaining portion being formed by said progressive die at one end of said post.

* * * * *